United States Patent
Liu et al.

(10) Patent No.: US 7,635,947 B2
(45) Date of Patent: Dec. 22, 2009

(54) ORGANIC ELECTRO-LUMINESCENCE DEVICE COMPRISING UNIFORM THICKNESS LIGHT-EMITTING LAYER

(75) Inventors: Pei-Yu Liu, Taipei (TW); Huai-An Li, Jhongli (TW); Yu-Cheng Lo, Taipei (TW); Jiun-Ming Wang, Changhua (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 572 days.

(21) Appl. No.: 11/214,946

(22) Filed: Aug. 29, 2005

(65) Prior Publication Data

US 2007/0046188 A1    Mar. 1, 2007

(51) Int. Cl.
H01J 1/62 (2006.01)
H01J 63/04 (2006.01)
H05B 33/00 (2006.01)

(52) U.S. Cl. ............... 313/506; 313/498; 313/504; 313/509; 428/690

(58) Field of Classification Search .......... 313/498–512
See application file for complete search history.

(56) References Cited

U.S. PATENT DOCUMENTS 7,153,592 B2 * 12/2006 Yoshikawa ............ 428/690
7,247,881 B2 * 7/2007 Lee et al. .............. 257/72
2004/0253368 A1  12/2004 Tokuda ................. 427/64
2005/0140277 A1 * 6/2005 Suzuki et al. .......... 313/504
2005/0208863 A1 * 9/2005 Yamazaki et al. ....... 445/24
2005/0230684 A1 * 10/2005 Seo et al. ............. 257/72
2008/0272691 A1 * 11/2008 Chen et al. ............ 313/504

FOREIGN PATENT DOCUMENTS

CN    1479560       3/2004
JP    11312590 A  * 11/1999

* cited by examiner

Primary Examiner—Sikha Roy
Assistant Examiner—Jose M Diaz
(74) Attorney, Agent, or Firm—J.C. Patents

(57) ABSTRACT

An organic electro-luminescence device and a manufacturing method thereof are disclosed. Wherein, the manufacturing method of an organic electro-luminescence device includes sequential steps of: providing a substrate first; forming a first electrode layer on the substrate; forming an insulating layer on the substrate, wherein the insulating layer includes a plurality of openings for exposing the first layer; forming a conducting layer on the sidewall of the insulating layer and on the first electrode layer in the openings; forming a light-emitting layer on the conducting layer in the openings; and finally forming a second electrode layer on the light-emitting layer. The organic electro-luminescence device and the manufacturing method thereof according to the present invention is capable of providing the light-emitting layer with a uniform thickness and therefore raising of yield of the fabricating process and improving of the displaying quality of the organic electro-luminescence device.

8 Claims, 4 Drawing Sheets

ORGANIC ELECTRO-LUMINESCENCE DEVICE COMPRISING UNIFORM THICKNESS LIGHT-EMITTING LAYER

BACKGROUND OF THE INVENTION

1. Field of Invention

The present invention relates to a light emitting device and a manufacturing method thereof. In particular, the present invention relates to an organic electro-luminescence device and a manufacturing method thereof.

2. Description of Related Art

With rapid advancement of semi-conductor devices and displays, the multimedia of modern societies proceeds more quickly. In respect of displays, owning to extraordinary features such as higher quality, better space utilization, lower power consumption and free of radiation, the flat panel display has gradually replacing traditional displays as the mainstream of the marketplace nowadays.

The flat panel display includes liquid crystal display (LCD), organic electro-luminescence display (OEL display), plasma display panel (PDP), etc. Here, the electro-luminescence device is a dots matrix type display having emissive devices. Also, the OEL device owns characteristics: no viewing angle restriction, low manufacturing cost, high response speed (up to a hundred times that of the liquid crystals), low power consumption, wide operating temperature range, light weight and easily miniaturized and streamlined as demanded. Hence, OEL device has the greatest potential to become the dominant type in the next generation of flat panel displays.

FIG. 1 is a cross-section schematic view of one organic electro-luminescence device (OEL device) in the prior art. Referring to FIG. 1 please, the OEL device is disposed on a substrate 100. As shown, the patterned insulating layer 120 has a plurality of openings 122 in which an anode layer 110 is disposed. Also, a light-emitting layer 130 is disposed on the anode layer 110 in the openings 122, and a cathode layer 140 is disposed on the light-emitting layer 130. During the manufacturing process of an OEL device, the ink-jet technique is usually used to fill light-emitting materials into the openings 122 to form the light-emitting layer 130. However, due to different materials of the anode layer 110 and insulating layer 120, the surfaces of the anode layer 110 and the sidewall of the insulating layer 120 have different absorption properties with respect to light-emitting materials. And thus the thickness of the formed light-emitting layer 130 is not uniform and it may lead to a phenomenon so-called lip height, as shown in FIG. 2A. Furthermore, if there is still residual light-emitting material remained on the insulating layer 120, light-emitting materials originally in both sides of the insulating layer 120 will cross over the insulating layer 120 and get blended.

The problems mentioned above would cause reduction of yield of the fabricating process and deterioration of displaying quality for the OEL device. Thus, ways to overcome the mentioned problems due to the interface of various materials between the anode layer and insulating layer and to form a uniform light-emitting layer are crucial keys to the raising of yield for the fabricating process of OEL device and the improved displaying quality thereof.

SUMMARY OF THE INVENTION

In view of this, one object of the present invention is to provide a manufacturing method of an organic electro-luminescence device (OEL device) capable of forming a light-emitting layer with a uniform thickness, and further raising yield of the fabricating process of an OEL device and displaying quality thereof.

Another object of the present invention is to provide an organic electro-luminescence device (OEL device) featuring of a light-emitting layer with a uniform thickness, and therefore providing better yield of the fabricating process of an OEL device and better displaying quality.

Basing on one object mentioned above or other objects, the present invention provides a manufacturing method of an organic electro-luminescence device. The manufacturing method of an organic electro-luminescence device sequentially comprises steps of: providing a substrate; forming a first electrode layer on the substrate; forming an insulating layer on the substrate, wherein the insulating layer includes a plurality of openings for exposing the first layer; forming a conducting layer on the sidewall of the insulating layer and on the first electrode layer in the openings; forming a light-emitting layer on the conducting layer in the openings; and finally forming a second electrode layer on the light-emitting layer.

In one preferred embodiment of the present invention, the step of forming the first electrode layer, for example, is to form an electrode material layer on the substrate and patterning the electrode material layer by a photolithography and etching process to form the first electrode layer.

In one preferred embodiment of the present invention, the step of forming the insulating layer, for example, is to form an insulating material layer on the substrate and patterning the insulating material layer by performing exposure and development to form the insulating layer. Wherein, a material of the insulating layer is a photosensitive material for example.

In one preferred embodiment of the present invention, the step of forming the conducting layer, for example, is to form an conducting material layer on the substrate and patterning the conducting material layer by performing a photolithography and etching process to form the conducting layer.

In one preferred embodiment of the present invention, the light-emitting layer may be formed by an ink-jet technique.

The present invention also provides an organic electroluminescence device. The organic electroluminescence device comprises a substrate, a first electrode layer, an insulating layer, a conducting layer, a light-emitting layer, and a second electrode layer. The first electrode layer is disposed on the substrate, and the insulating layer disposed on the substrate comprises a plurality of openings for exposing the first electrode layer. Additionally, the conducting layer is disposed on the sidewall of the patterned insulating layer and on the first electrode layer in the openings. The light-emitting layer is disposed on the conducting layer in the openings, and the second electrode layer is disposed on the light-emitting layer.

In one preferred embodiment of the present invention, the substrate for example is a transparent glass, and a material of the transparent substrate is glass.

In one preferred embodiment of the present invention, the substrate for example is an active device array substrate such as a thin film transistor substrate.

In one preferred embodiment of the present invention, a material of the first electrode layer, for example, is a transparent conducting material such as Indium Tin Oxide (ITO) or Indium Zinc Oxide (IZO), for example.

In one preferred embodiment of the present invention, a material of the conducting layer, for example, is a transparent conducting material such as Indium Tin Oxide (ITO) or Indium Zinc Oxide (IZO).

In one preferred embodiment of the present invention, a material of the light-emitting layer, for example, is a polymer electro-luminescent material.

The organic electro-luminescence device and the manufacturing method thereof according to the present invention is to form a conducting layer on the first electrode layer and on the sidewall of the insulating layer in the OEL device. Accordingly, the yield of the fabricating process and the displaying quality of the OEL device can be effectively improved. Therefore, the thickness of the light-emitting layer can be uniform due to formation of the light-emitting layer on the conducting layer i.e. on the interface of same material. Accordingly, the yield of the fabricating process and the displaying quality of an OEL device according to the present invention can be effectively improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 3A to 3I are flowcharts, sequentially and schematically illustrating the manufacturing method of an organic electro-luminescence device (OEL Device) according to one preferred embodiment of the present invention.

Figure 3A:
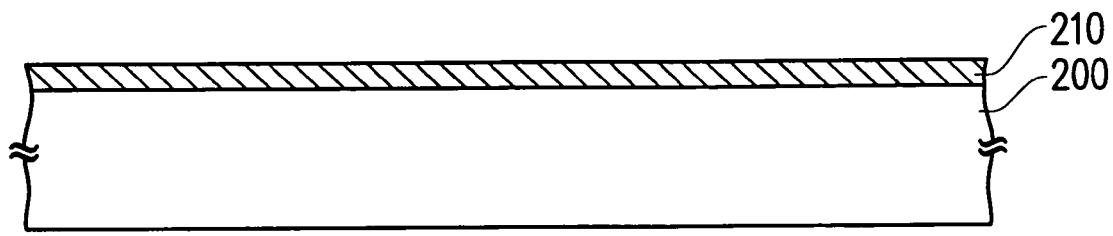
FIGS. 3A to 3I are flowcharts schematically showing the manufacturing of an electro-luminescence device according to one preferred embodiment of the present invention.

A substrate 200 is provided first, as shown in FIG. 3A. In one preferred embodiment, the substrate 200 for example is a transparent glass substrate for the manufacturing of a passive-type organic electro-luminescence device. In one another embodiment, the substrate 200 on which a plurality of active devices are formed, such as a thin film transistor array (TFT array), is used for manufacturing an active-type organic electro-luminescence device. In addition, an electrode material layer 210 is formed on the substrate 200 by utilizing the physical vapor deposition (PVD) or the chemical vapor deposition (CVD).

Figure 3B:
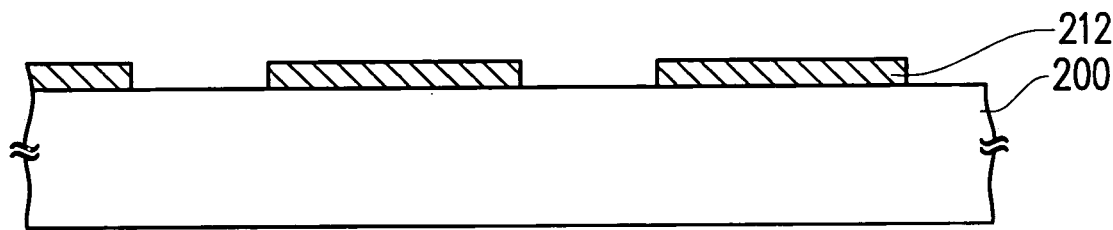

Next, referring to FIG. 3B, a step of patterning the electrode material layer 210 is performed to form an electrode layer 212. Here, the electrode layer 212, can be served as an anode in the organic electro-luminescence device, for example. In one preferred embodiment, for example, the electrode material layer 210 is patterned by performing a photolithography and etching process. Besides, the electrode layer 212 for example is made of a transparent conducting material, which can be Indium Tin Oxide (ITO) or Indium Zinc Oxide (IZO).

Figure 3C:
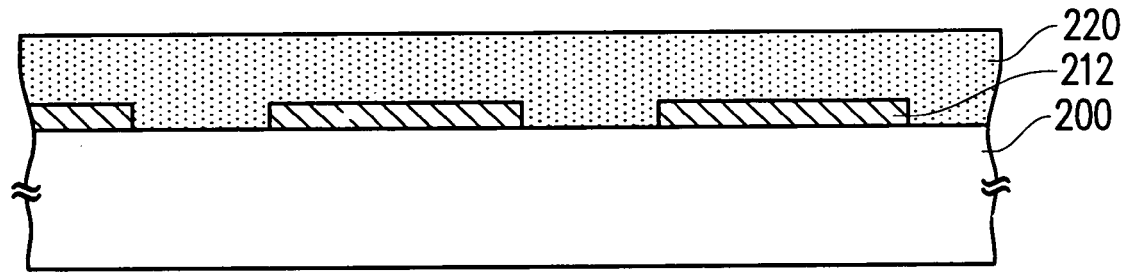

Later, as shown in FIG. 3C, an insulating material layer 220 is formed on the substrate 200 by utilizing the chemical vapor deposition (CVD), wherein the insulating material layer 220 covers the electrode layer 212, and the material of the insulating material layer 220 can be a photosensitive material.

Figure 3D:
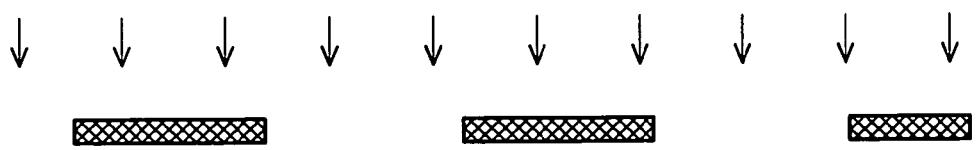
Figure 3D:
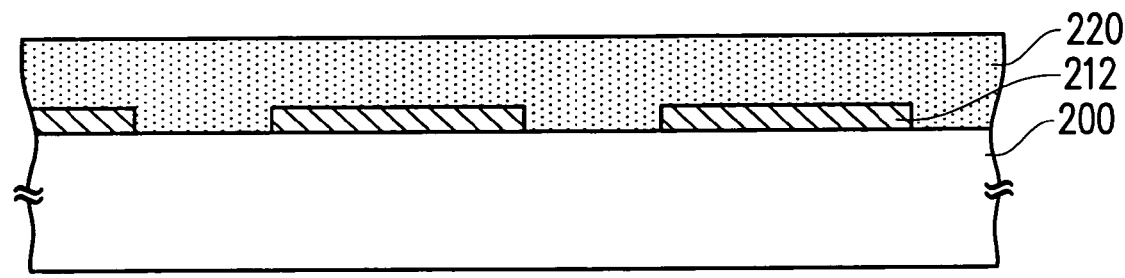
Figure 3E:
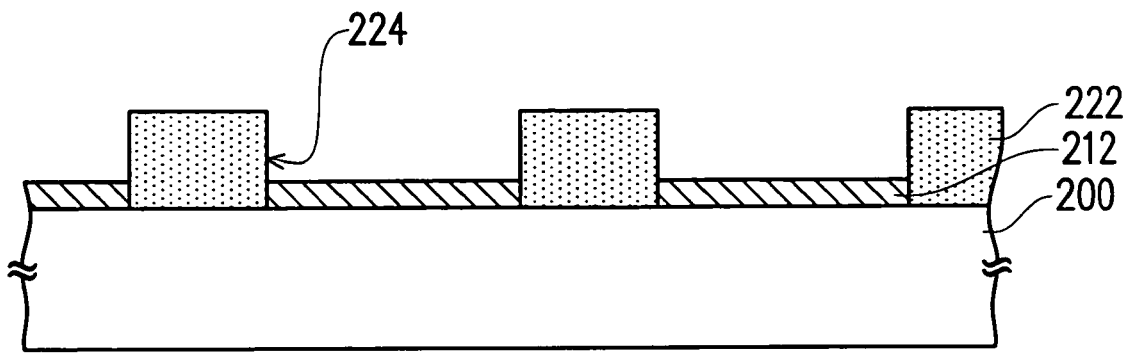

Subsequently, in FIGS. 3D and 3E, a step of an exposure process and a development process for patterning of the insulating material layer 220 is performed to form an insulating layer 222. Here, the insulating layer 222 owns a plurality of openings 224 for exposing at least part of the electrode layer 212.

Figure 3F:
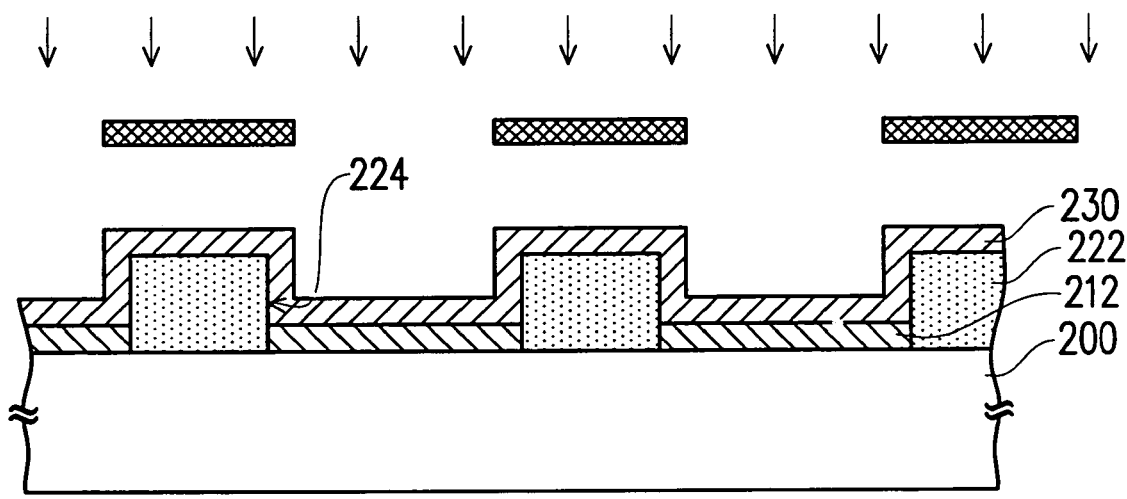

Then, as shown in FIG. 3F a conducting material layer 230 is formed on the substrate 200 by utilizing the physical vapor deposition (PVD) or the chemical vapor deposition (CVD), and a step of patterning the conducting material layer 230 is performed. In one preferred embodiment, the conducting material layer 230 can be patterned by performing a photolithography and etching process, for example.

Figure 3G:
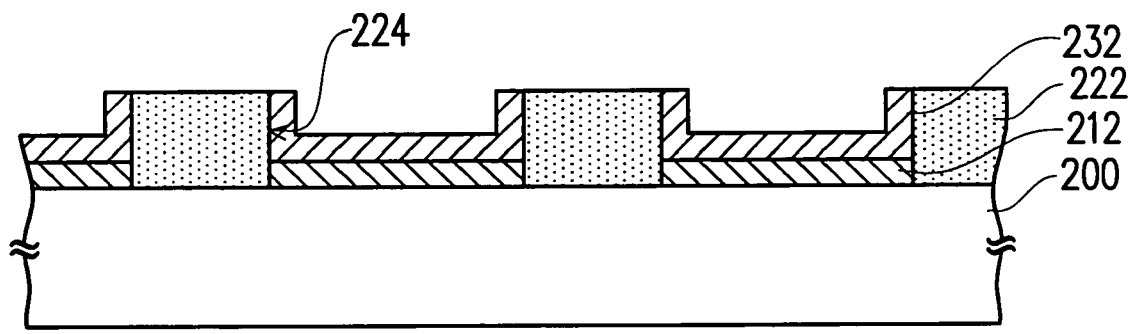

In FIG. 3G, after patterning the conducting material layer 230, a conducting layer 232 is formed. The conducting layer 232 is disposed on the sidewall of the insulating layer 222 and on the electrode layer 212 in the openings 224 for exposing top surface of the insulating layer 222. It is worthy to note that a material of the conducting layer 232, which can be Indium Tin Oxide (ITO) or Indium Zinc Oxide (IZO), is identical to that of the electrode layer 212.

Figure 3H:
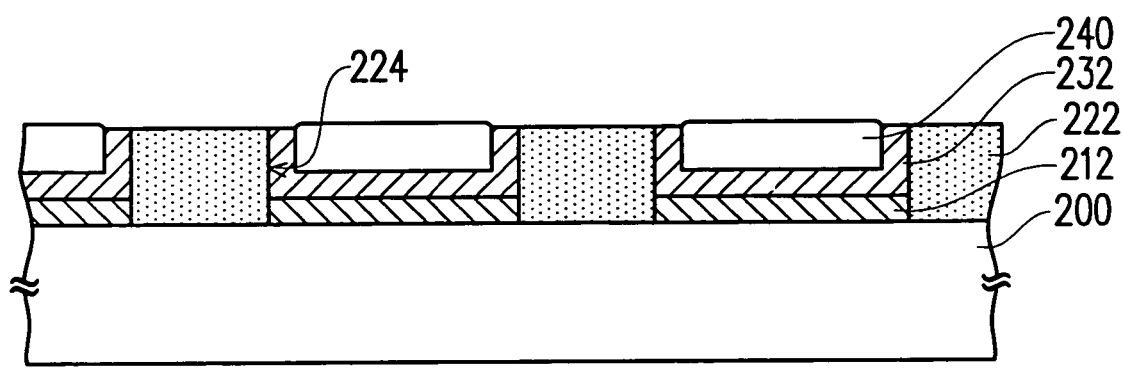

And then in FIG. 3H, a light-emitting layer 240 is formed on the exposed conducting layer 232 in the openings 224. In the present embodiment, the light-emitting layer 240 is formed on the conducting layer 232 by an ink-jet technique for example. Furthermore, a material of the light-emitting layer 240 can be a polymer electro-luminescent material for instance.

It can easily understood that Evaporation method or other proper methods can also be utilized to form the light-emitting layer 240 with a small-molecule electro-luminescent material in other embodiments of the present invention.

Figure 3I:
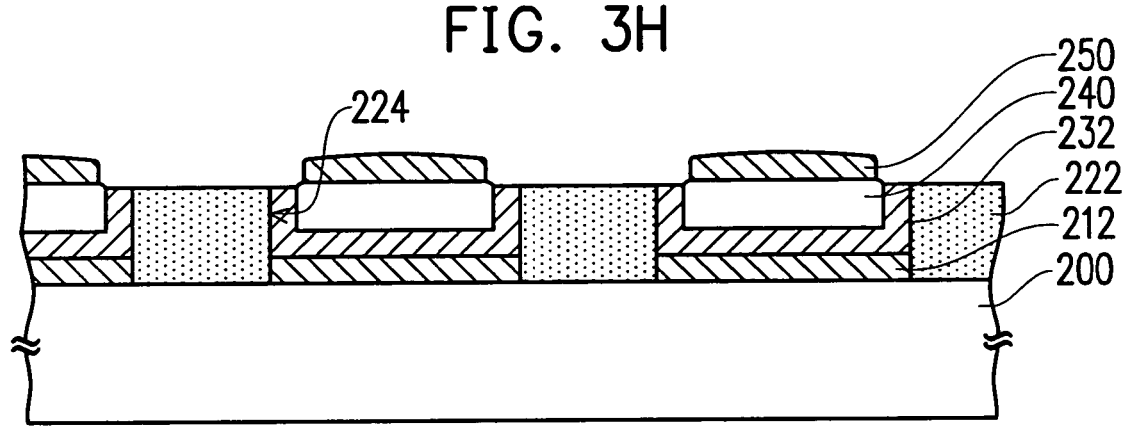

Finally, an electrode layer 250 is formed on the light-emitting layer 240 by utilizing the physical vapor deposition (PVD) or the chemical vapor deposition (CVD) as shown in FIG. 3I. Here, the electrode layer 250, for example, can be served as a cathode in the organic electro-luminescence device, and a material of the electrode layer 250 can be a transparent conducting material such as Indium Tin Oxide (ITO) or Indium Zinc Oxide (IZO).

Figure 1:
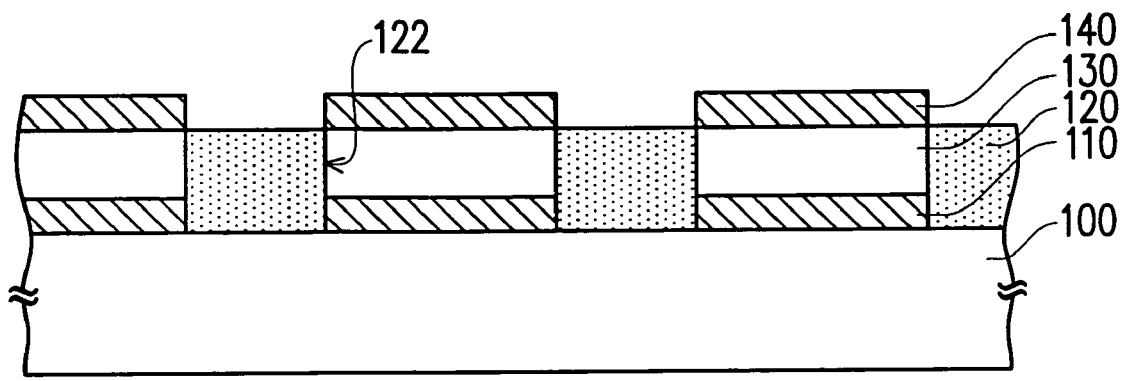
FIG. 1 is a cross-section schematic view of one electro-luminescence device in the prior art.
Figure 2A:
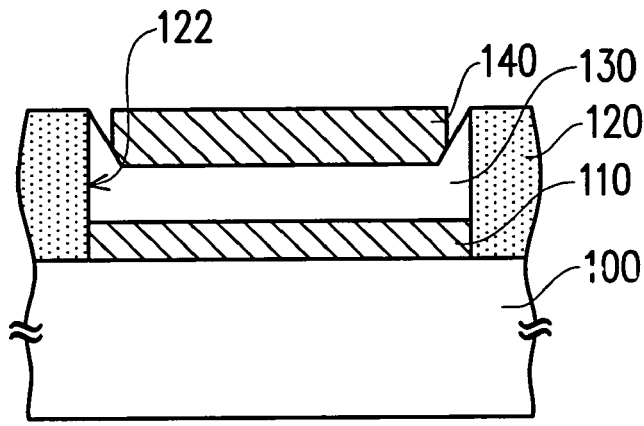
FIGS. 2A to 2B are cross-section schematic view of another electro-luminescence device in the prior art.
Figure 2B:
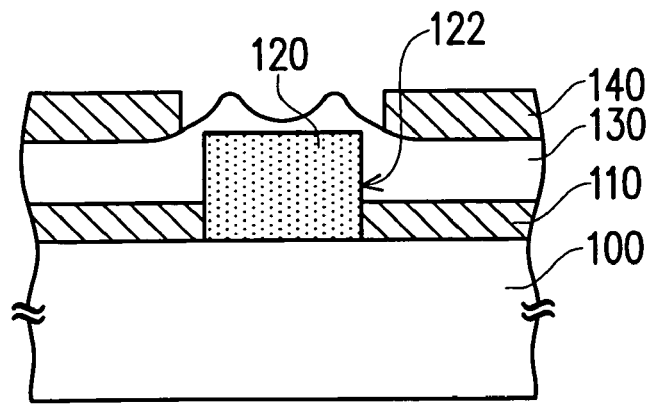

Please refer to FIGS. 2A, 2B, and 3I simultaneously. It is worthy to note that the manufacturing method of an OEL device based on the present invention is to form a material layer, a conducting layer 232 such as Indium Tin Oxide (ITO) or Indium Zinc Oxide (IZO), on the electrode layer 212 and on the sidewall of the insulating layer 222 before forming the light-emitting layer 240 in the opening 224. Thus, formation of the conducting layer 232 is mainly aimed at obtaining the light-emitting layer 240 with a uniform thickness by allowing the light-emitting materials to be formed on the same material interface i.e. on the conducting layer 232. By doing so, the lip height phenomenon shown in FIG. 2A or blending of light-emitting materials shown in FIG. 2B can be effectively avoided, and yield of the fabricating process and the displaying quality of the OEL device utilizing the present invention can be further improved.

In addition, the manufacturing method of an OEL device according to the present invention can also be applied in the fabricating process that is to form a coating layer on the interface between two different materials. Take one for example. In the fabricating process of the color filter (CF), after the formation of the black matrix owning a plurality of openings, a photoresist layer or other adaptive material layers can be formed on the sidewall of the black matrix and the exposed substrate thereof. Subsequently, a color-filtering layer with a more uniform thickness is formed on this material layer so as to raise yield of the fabricating process of the color filter.

To sum up, the OEL device and the manufacturing method thereof of the present invention is to prevent the phenomenon of the prior art having an inconsistent layer thickness due to the interface between different materials, by forming a conducting layer, that is capable of increasing adhesive property of materials, on top surface of the electrode layer and on the sidewall of the insulating layer in the OEL device. Accordingly, the yield of the fabricating process and the displaying quality of the OEL device can be effectively improved.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An organic electro-luminescence device, comprising:
    a substrate;
    a first electrode layer disposed on the substrate;
    an insulating layer disposed on the substrate, wherein the insulating layer comprising a plurality of openings for exposing the first electrode layer;
    a conducting layer disposed on a sidewall of the insulating layer and on the first electrode layer in the openings, wherein a material of the conducting layer comprises a transparent conducting material and the transparent conducting material comprises Indium Tin Oxide (ITO) or Indium Zinc Oxide (IZO);
    a light-emitting layer disposed on the conducting layer in the openings, wherein the conducting layer is sandwiched between the first electrode layer and the light-emitting layer and between the sidewall of the insulating layer and a sidewall of the light-emitting layer; and
    a second electrode layer disposed on the light-emitting layer.

2. The organic electro-luminescence device according to claim 1, wherein the substrate is a transparent substrate.

3. The organic electro-luminescence device according to claim 2, wherein a material of the substrate comprises glass.

4. The organic electro-luminescence device according to claim 1, wherein the substrate is an active device array substrate.

5. The organic electro-luminescence device according to claim 4, wherein the substrate is a thin film transistor array substrate.

6. The organic electro-luminescence device according to claim 1, wherein a material of the first electrode layer comprises a transparent conducting material.

7. The organic electro-luminescence device according to claim 6, wherein a material of the first electrode layer comprises Indium Tin Oxide (ITO) or Indium Zinc Oxide (IZO).

8. The organic electro-luminescence device according to claim 1, wherein a material of the light-emitting layer comprises a polymer electro-luminescent material.

\* \* \* \* \*